United States Patent [19]
Eberhard et al.

[11] Patent Number: 4,644,190
[45] Date of Patent: Feb. 17, 1987

[54] DYNAMIC MOS CIRCUIT

[75] Inventors: Guenther Eberhard, Eichenau; Joachim Krause, Vaterstetten, both of Fed. Rep. of Germany

[73] Assignee: Siemens Aktiengesellschaft, Berlin & Munich, Fed. Rep. of Germany

[21] Appl. No.: 632,660

[22] Filed: Jul. 20, 1984

[30] Foreign Application Priority Data

Aug. 11, 1983 [DE] Fed. Rep. of Germany ....... 3329093

[51] Int. Cl.$^4$ .................. H03K 19/094; H03K 19/20; H03K 19/017; H03K 5/12
[52] U.S. Cl. .................... 307/450; 307/482; 307/578; 307/270
[58] Field of Search ............... 307/450, 448, 482, 578, 307/270, 263, 268, 246

[56] References Cited

U.S. PATENT DOCUMENTS

| | | | |
|---|---|---|---|
| Re. 27,305 | 3/1972 | Polkinghorn et al. | 307/482 X |
| 3,743,862 | 7/1973 | Bell | 307/578 |
| 4,071,783 | 1/1978 | Knepper | 307/482 X |
| 4,176,289 | 11/1979 | Leach et al. | 307/270 |
| 4,250,408 | 2/1981 | Spence | 307/482 X |
| 4,317,051 | 2/1982 | Young, Jr. | 307/270 X |
| 4,431,927 | 2/1984 | Eaton, Jr. et al. | 307/583 X |
| 4,500,799 | 2/1985 | Sud et al. | 307/482 X |

FOREIGN PATENT DOCUMENTS

| | | | |
|---|---|---|---|
| 0045133 | 3/1982 | European Pat. Off. | |
| 156427 | 12/1980 | Japan | 307/482 |
| 646441 | 5/1979 | U.S.S.R. | 307/482 |
| 668092 | 6/1979 | U.S.S.R. | 307/482 |

OTHER PUBLICATIONS

Gabric et al, "MOSFET Self-Bootstrapping Inverter Driver Circuit"; *IBM-TDB;* vol. 24, No. 10, pp. 5055-5056; 3/1982.
Harroun, "Bootstrap Inverter Driver"; *IBM-TDB;* vol. 19, No. 3, pp. 827-828; 8/1976.
Engineer's Notebook, Electronics, Jun. 30, 1981 "Dynamic Depletion Circuits Upgrade MOS Performance", p. 128.

*Primary Examiner*—Larry N. Anagnos
*Attorney, Agent, or Firm*—Hill, Van Santen, Steadman & Simpson

[57] ABSTRACT

A dynamic MOS-circuit comprising a bootstrap capacitor decoupled by an output transistor and wherein the bootstrap capacitor is discharged via a MOS-FET. The MOS-FET is connected as a constant current source. With the invention, a control voltage at an output MOS-FET is nearly double an operating voltage of the circuit.

3 Claims, 3 Drawing Figures

DYNAMIC MOS CIRCUIT

BACKGROUND OF THE INVENTION

The invention relates to a dynamic MOS circuit comprised of a series connection of a first control MOS-FET, a discharge MOS-FET whose drain input is connected to a bootstrap capacitor, and a first switching MOS-FET. The circuit further comprises a second series connection of a second control MOS-FET and a second switching transistor activatable via the discharge MOS-FET.

An important feature of a MOS circuit, as is known, is its dynamic behavior. Related to this is the dependency of the switching speed upon the load capacitances, since with an increasing load, the switching speed decreases. In addition, the height of the output level is to be noted which should lie as close as possible to the operating voltage. From Electronics, June 30, 1981, Page 128, incorporated herein by reference, a dynamic MOS-circuit is known which switches or connects high load capacitances and exhibits an output voltage which corresponds approximately to the operating voltage. This driver module consists of an input inverter and two switching stages with a bootstrap capacitor decoupled from the input of the output transistor. In the case of a low-value input signal, the capacitor is charged so that a transistor, activated by the input signal, reduces a flowing-off of the charge. The voltage at the capacitor here lies below the operating voltage. If the input signal increases, the output transistor is activated, in dependence on the capacitor voltage, via the above-mentioned discharge transistor. It is disadvantageous here that the control voltage generated in this fashion has a relatively low maximum value. Moreover, the edge steepness of the output signal is dependent upon the edge steepness of the input signal. A shallow rise is automatically transmitted from the input to the output. However, signal edges which are as steep as possible are desired.

SUMMARY OF THE INVENTION

Accordingly, an object of the invention is to disclose a circuit of the initially cited type with which output signals of high edge steepness and high levels are generated.

This object is achieved by virtue of the fact that the discharge MOS-FET is connected as a constant current source.

In this manner, the discharge operation of the bootstrap capacitor becomes independent of the progression of the input signal. In addition, the invention has the advantage that a control voltage for the output MOS-FET is generated which approximately corresponds to double the operating voltage. In addition, the circuit expense is reduced, since no input inverter is required.

DESCRIPTION OF THE PREFERRED EMBODIMENTS

Figure 1:
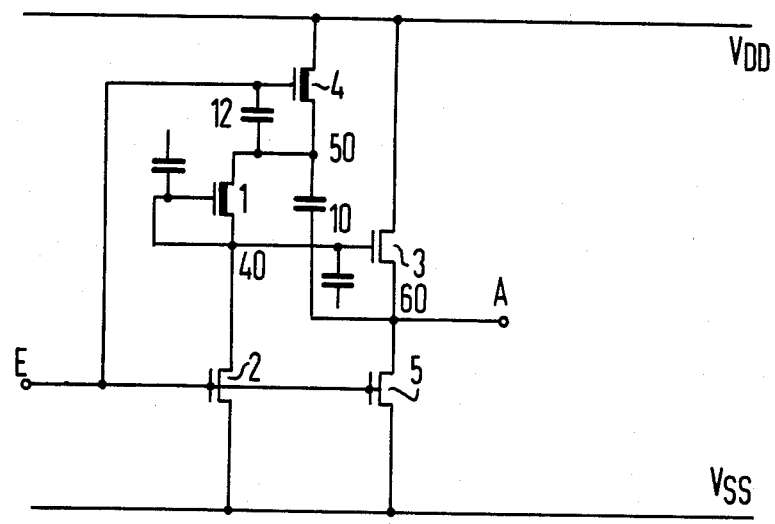
FIGS. 1 and 2 respectively show a MOS circuit.

The single-channel MOS-driver circuit of FIG. 1 is comprised of a first series connection of a first control MOS-FET 2 of the enhancement type, a load MOS-FET 1 as the discharge MOS-FET and connected as a constant source, and a first switching MOS-FET 4 of the depletion type, respectively. In addition, it exhibits a second series connection of a second control MOS-FET 5 and a second switching MOS-FET 3 of the enhancement type. The control input of the second switching MOS-FET 3 is connected to a first node 40 in the control path between the first control MOS-FET 2 and the load MOS-FET 1. A bootstrap capacitor 10 connects a second node 50 with a third node 60 which represents the output of the circuit. The node 50 is disposed in the controlled path between the load MOS-FET 1 and the first switching MOS-FET 4.

In the case of an input signal E which is high, the two control MOS-FETs 2 and 5 are conductive and the first and the third node 40, 60 lie at a reference potential in the proximity of $V_{SS}$. Via the first switching MOS-FET 4, likewise activated by the input signal E, the bootstrap capacitor 10, and hence the second node 50, is charged to the value of an operating voltage $V_{DD}$. The difference in relation to the operating voltage $V_{DD}$ is apparent from the voltage drops at the second control MOS-FET 5 and at the first switching MOS-FET 4.

If the input signal E changes to the reference potential $V_{SS}$, the two control MOS-FETs 2 and 5 block. The voltage at the first node 40 rises to the value of the voltage at the second node 50. The second switching MOS-FET 3 is thus opened. It thus causes the rise of the third node 60 to the operating voltage $V_{DD}$. Since the first switching MOS-FET 4 blocks, the control voltage of the second switching MOS-FET 3 (output MOS-FET) at the first node 40 is composed of the operating voltage $V_{DD}$ and the voltage dropping at the bootstrap capacitor 10. The value of the summed-up voltage more closely approximates the value of double the operating voltage $V_{DD}$ the smaller the schematically indicated parasitic capacitances are at the first and second nodes 40 and 50 in relation to the capacitance of the bootstrap capacitor 10.

Through a capacitive coupling (capacitor 12) between the input of the circuit and the second node 50, an edge delay, desired in some instances, can be adjusted.

Figure 2:
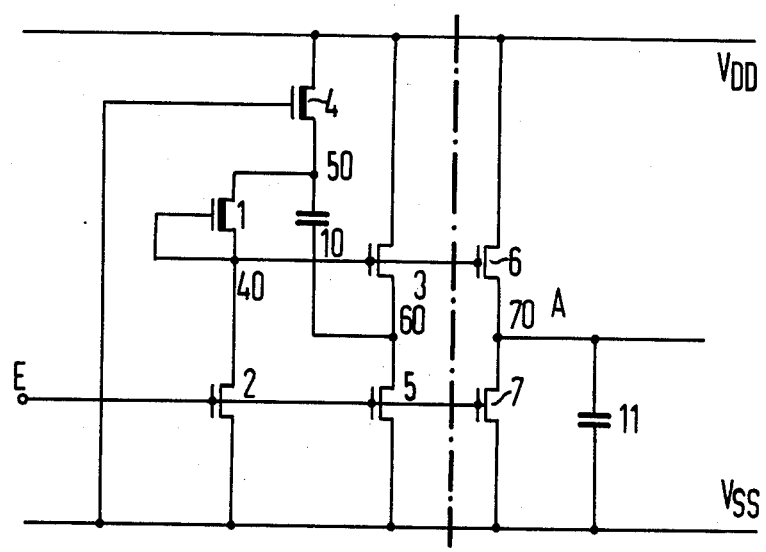

FIG. 2 shows an additional single channel MOS-driver circuit comprising a push-pull output stage (MOS-FETs 6 and 7 of the enhancement type). In contrast to the circuit in FIG. 1, the control input of the first switching MOS-FET 4 is subjected to the reference potential $V_{SS}$. Like the circuit reproduced in FIG. 3, it is particularly suited for the connection of higher capacitive loads at the output which are represented as capacitor 11. The control voltage of the MOS-FET 6 is tapped off at the first node 40. Thus, the third node 60 is decoupled from the capacitive load 11. The voltage progression of the output signal A at the third node 60 thus directly follows the voltage progression of the first node 40.

Figure 3:
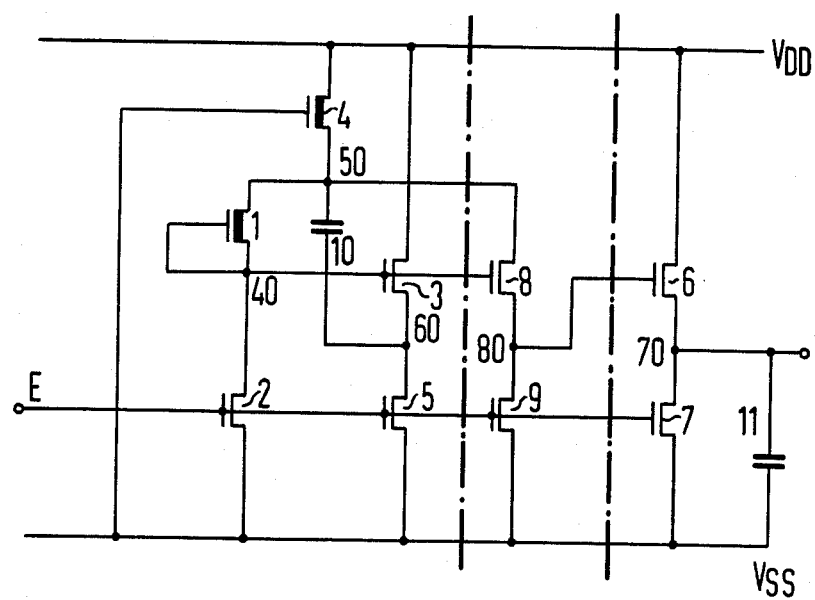
FIG. 3 shows a further development of the circuit according to FIG. 1.

In FIG. 3, a driver stage consisting of two additional MOS-FETs 8 and 9 of the enhancement type is connected before the push-pull output stage. The controlled path of the additional MOS-FETs 8 and 9 connected in series, connects the second node 50 with the reference potential $V_{SS}$. In this manner, the first node 40 is further unloaded. The activation of the MOS-FET 6 proceeds via the common connection point of the MOS-FETs 8 and 9.

In a further advantageous sample embodiment, the first switching MOS-FET 4 is of the enhancement type.

Its control input, in this case, is connected to the operating voltage $V_{DD}$ (not shown in FIG. 3).

Although various minor changes and modifications might be suggested by those skilled in the art, it will be understood that we wish to include within the claims of the patent warranted hereon all such changes and modifications as reasonably come without our contribution to the art.

We claim as our invention:

1. A dynamic MOS circuit, comprising:
   an operating potential and a reference potential connected to operate the dynamic MOS circuit;
   an input terminal for the MOS circuit;
   a first enhancement type control MOS-FET having its gate connected to the input terminal, a first end of its channel connected to the reference potential, and a second end of its channel connecting to a first end of a channel of a discharge MOS-FET connected as a current source;
   said discharge MOS-FET having its gate connected to said first end of its channel and having a second end of its channel connecting to a first end of a channel of a depletion type first switching MOS-FET;
   said first switching MOS-FET having its gate directly connecting to said input terminal and a second end of its channel connecting to said operating potential;
   a second enhancement type control MOS-FET having a first end of its channel connecting to the reference potential, a second end of its channel connecting to an output terminal, and its gate connecting to said input terminal;
   a second enhancement type switching MOS-FET having a first end of its channel connecting to said output terminal, a second end of its channel connecting to said operating potential, and its gate connecting to the first end of the channel of the discharge MOS-FET;
   a boot strap capacitor having a first end connecting to the first end of the channel of the first switching MOS-FET and its second end connecting to the output terminal; and
   a capacitor connected between the gate of the first switching MOS-FET and the first end of the channel of the first switching MOS-FET, a capacitance of the capacitor being selected for a desired edge delay of an input signal at the input terminal.

2. A dynamic MOS circuit, comprising:
   an operating potential and a reference potential connected to operate the dynamic MOS circuit;
   an input terminal for the MOS circuit;
   a first enhancement type control MOS-FET having its gate connected to the input terminal, a first end of its channel connected to the reference potential, and a second end of its channel connecting to a first end of a channel of a discharge MOS-FET connected as a current source;
   said discharge MOS-FET having its gate connected to said first end of its channel and having a second end of its channel connecting to a first end of a channel of a depletion type first switching MOS-FET;
   said first switching MOS-FET having its gate connecting directly to said reference potential and a second end of its channel connecting to said operating potential;
   a second enhancement type control MOS-FET having a first end of its channel connecting to the reference potential, and its gate connecting to said input terminal;
   a second enhancement type switching MOS-FET having a first end of its channel connecting to a second end of the channel of the second control MOS-FET, a second end of its channel connecting to said operating potential, and its gate connecting to the first end of the channel of the discharge MOS-FET;
   a boot strap capacitor having a first end connecting to the first end of the channel of the first switching MOS-FET and its second end connecting to the second end of the channel of the second control MOS-FET; and
   a push-pull output stage formed of first and second enhancement type MOS-FETs, the first MOS-FET having a first end of its channel connecting to the reference potential, its gate connecting to the input terminal, and a second end of its channel connecting to an output terminal, and the second enhancement MOS-FET having a first end of its channel connecting to the output terminal, its gate connecting to a gate of the second switching MOS-FET, and a second end of its channel connecting to the operating potential.

3. A dynamic MOS circuit, comprising:
   an operating potential and a reference potential connected to operate the dynamic MOS circuit;
   an input terminal for the MOS circuit;
   a first enhancement type control MOS-FET having its gate connected to the input terminal, a first end of its channel connected to the reference potential, and a second end of its channel connecting to a first end of a channel of a discharge MOS-FET connected as a current source;
   said discharge MOS-FET having its gate connected to said first end of its channel and having a second end of its channel connecting to a first end of a channel of a depletion type first switching MOS-FET;
   said first switching MOS-FET having its gate directly connecting to said reference potential and a second end of its channel connecting to said operating potential;
   a second enhancement type control MOS-FET having a first end of its channel connecting to the reference potential, and its gate connecting to said input terminal;
   a second enhancement type switching MOS-FET having a first end of its channel connecting to a second end of the channel of the second MOS-FET, a second end of its channel connecting to said operating potential, and its gate connecting to the first end of the channel of the discharge MOS-FET;
   a boot strap capacitor having a first end connecting to the first end of the channel of the first switching MOS-FET and its second end connecting to the second end of the channel of the second MOS-FET;
   a driver stage formed of first and second enhancement type MOS-FETs, the first MOS-FET having a first end of its channel connecting to the reference potential, its gate connecting to the input terminal, and a second end of its channel connecting to a first end of a channel of the second MOS- FET, and the second enhancement MOS-FET having its gate connecting to a gate of the second switching MOS-FET, and a second end of its channel connecting to the first end of the channel of the first switching MOS-FET; and a push-pull output stage having first and second enhancement type MOS-FETs, the first MOS-FET having a first end of its channel connecting to the reference potential, its gate connecting to the input terminal, and a second end of its channel connecting to an output terminal, and the second enhancement MOS-FET having a first end of its channel connecting to the output terminal, its gate connecting to the first end of the channel of the second enhancement MOS-FET of the driver stage, and a second end of its channel connecting to the operating potential.

* * * * *